United States Patent
Zaitsu et al.

(10) Patent No.: US 9,431,104 B2
(45) Date of Patent: Aug. 30, 2016

(54) RECONFIGURABLE CIRCUIT AND METHOD OF PROGRAMMING THE SAME

(71) Applicant: KABUSHIKI KAISHA TOSHIBA, Tokyo (JP)

(72) Inventors: Koichiro Zaitsu, Kanagawa (JP); Shinichi Yasuda, Tokyo (JP); Kosuke Tatsumura, Kanagawa (JP); Mari Matsumoto, Kanagawa (JP); Masato Oda, Kanagawa (JP); Reika Ichihara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/884,215

(22) Filed: Oct. 15, 2015

(65) Prior Publication Data

US 2016/0035419 A1 Feb. 4, 2016

Related U.S. Application Data (63) Continuation of application No. PCT/JP2014/067258, filed on Jun. 27, 2014.

(30) Foreign Application Priority Data

Jul. 11, 2013 (JP) ................................. 2013-145652

(51) Int. Cl.
  *G11C 11/00* (2006.01)
  *G11C 13/00* (2006.01)
  *H03K 19/177* (2006.01)

(52) U.S. Cl.
  CPC ....... *G11C 13/0069* (2013.01); *G11C 13/0002* (2013.01); *G11C 13/0004* (2013.01);
  (Continued)

(58) Field of Classification Search
  CPC ................................................... G11C 11/00
  USPC ........... 365/46, 94, 100, 129, 148, 158, 163; 257/2–5, 9, 295, 310, E21.35; 438/95, 438/96, 135, 166, 240, 365, 482, 486, 597, 438/785
  See application file for complete search history.

(56) References Cited

U.S. PATENT DOCUMENTS 8,422,269 B2    4/2013   Sasaki et al.
8,681,579 B2 *  3/2014   Carter .................... G11C 7/12
                                                365/189.06

(Continued)

FOREIGN PATENT DOCUMENTS

JP    2007-52641      3/2007
JP    2008-219011     9/2008

(Continued)

OTHER PUBLICATIONS

International Search Report issued by the Japanese Patent Office in International Application PCT/JP2014/067258, mailed Aug. 19, 2014 (2 pages).

(Continued)

*Primary Examiner* — Harry W Byrne
(74) *Attorney, Agent, or Firm* — Finnegan, Henderson, Farabow, Garrett & Dunner LLP (57) ABSTRACT

A reconfigurable circuit according to an embodiment includes: first wiring lines; second wiring lines crossing the first wiring lines; resistive change elements disposed in intersection regions of the first and second wiring lines, each of the resistive change elements including a first terminal connected to the one of the first wiring lines and a second terminal connected to the one of the second wiring lines, and being switchable between a low-resistance state and a high-resistance state; a first control circuit controlling a voltage to be applied to the first wiring lines; a second control circuit controlling a voltage to be applied to the second wiring lines; and current limiting elements corresponding to the second wiring lines, and controlling current flowing through the resistive change elements connected to the corresponding second wiring line.

20 Claims, 11 Drawing Sheets

(52) U.S. Cl.
CPC ....... *G11C13/0007* (2013.01); *G11C 13/0023* (2013.01); *H03K 19/1776* (2013.01); *G11C 2013/0078* (2013.01); *G11C 2213/77* (2013.01)

(56) References Cited

U.S. PATENT DOCUMENTS

| | | |
|---|---|---|
| 2007/0041235 A1 | 2/2007 | Inoue |
| 2008/0211540 A1 | 9/2008 | Fujita |
| 2009/0207647 A1 | 8/2009 | Maejima et al. |
| 2011/0122680 A1 | 5/2011 | Ikeda et al. |
| 2011/0205783 A1 | 8/2011 | Murooka |
| 2012/0026778 A1 | 2/2012 | Maejima |
| 2012/0243294 A1 | 9/2012 | Kaneko et al. |
| 2013/0070534 A1* | 3/2013 | Carter ............ G11C 7/12 365/189.05 |
| 2016/0065218 A1 | 3/2016 | Oda |

FOREIGN PATENT DOCUMENTS

| | | |
|---|---|---|
| JP | 2009-193629 | 8/2009 |
| JP | 2010-9669 | 1/2010 |
| JP | 2011-175716 | 9/2011 |
| JP | 2012-27997 | 2/2012 |
| JP | 2012-169023 | 9/2012 |
| JP | 2012-203946 | 10/2012 |
| JP | 2015-026901 | 2/2015 |
| WO | WO 2015/012305 A1 | 1/2015 |

OTHER PUBLICATIONS

International Preliminary Report on Patentability and Written Opinion issued by The International Bureau of WIPO on Jan. 12, 2016, for International Application No. PCT/JP2014/067258.

* cited by examiner

RECONFIGURABLE CIRCUIT AND METHOD OF PROGRAMMING THE SAME

CROSS REFERENCE TO RELATED APPLICATIONS

This application is a continuation of International Application No. PCT/JP2014/067258, filed on Jun. 27, 2014, which is based upon and claims the benefit of priority from the prior Japanese Patent Application No. 2013-145652, filed on Jul. 11, 2013, the entire contents of which are incorporated herein by reference.

FIELD

Embodiments described herein relate generally to reconfigurable circuits and methods of programming the same.

BACKGROUND

Programmable logic devices are semiconductor integrated circuits that can be rewritten after the chip manufacturing. A programmable logic device includes a plurality of wiring lines, of which two selected wiring lines are electrically connected or disconnected. Various methods exist to control the connection states.

One of the methods for controlling the connection of wiring lines uses a transistor and a memory element. The memory element can be electrically programmed, and the transistor is turned ON or OFF in accordance with the programmed information. An SRAM is usually used as the memory element.

Another method provides a programmable circuit (reconfigurable circuit) in which resistive change elements are disposed in intersection regions of wiring lines. Each resistive change element is, for example, a two-terminal nonvolatile resistive change element which switches between a low-resistance state and a high-resistance state if a predetermined voltage is applied between the two terminals.

When a voltage is applied between the two terminals of the nonvolatile resistive change element in order to switch it from the high-resistance state to the low-resistance state, a current flows between the two terminals. If the current is excessive, dispersion of the resistance of the resistive change element switched to the low-resistance state may be large. Therefore, a mechanism for preventing an excessive current that is greater than a predetermined value from flowing between the two terminals of the resistive change element, for example a current limiting element, is generally provided.

DETAILED DESCRIPTION

A reconfigurable circuit according to an embodiment includes: a first wiring line group including a plurality of first wiring lines to which signals are inputted; a second wiring line group including a plurality of second wiring lines from which signals are outputted, the second wiring lines crossing the first wiring lines; a plurality of resistive change elements disposed in intersection regions of the first wiring lines and the second wiring lines, each of the resistive change elements including a first terminal connected to one of the first wiring lines and a second terminal connected to one of the second wiring lines, and each of the resistive change elements being switchable between a low-resistance state and a high-resistance state; a first control circuit configured to control a voltage to be applied to the first wiring lines; a second control circuit configured to control a voltage to be applied to the second wiring lines; and a plurality of current limiting elements corresponding to the second wiring lines, and each of the current limiting elements being configured to control current flowing through the resistive change elements connected to the corresponding second wiring line.

Before the embodiments of the present invention are described, how the embodiment has been achieved will be described.

A known programmable, reconfigurable circuit, in which resistive change elements are disposed in intersection regions of wiring lines, includes current limiting elements for preventing an excessive current with more than a predetermined value from flowing between the terminals of a memory element when data stored in the resistive change element is being programmed.

The chip area may be increased if at least one current limiting element is disposed for each resistive change element. Therefore, it is preferable that each current limiting element is shared by a plurality of resistive change elements. However, if a current limiting element is shared by a resistive change element in a low-resistance state and a resistive change element in a high-resistance state, and a program voltage is applied to the high-resistance resistive change element to bring it into a low-resistance state, a voltage drop may be caused at the current limiting element. This may prevent the required voltage from being applied to the selected resistive change element.

No means is known at the present stage for solving this problem with a preferable cell configuration for a programmable logic device, which allows a current limiting element to be shared by a plurality of resistive change elements.

The inventors of the present application have found, through a diligent study, a reconfigurable circuit and a program method of the reconfigurable circuit, which can apply a required voltage to a selected memory cell even if a current limiting element is shared by a plurality of resistive change elements, and which can suppress variations in the resistance of resistive change elements disposed in intersection regions of a plurality of wiring lines. The embodiments described below represent the above features.

Embodiments

Figure 1:
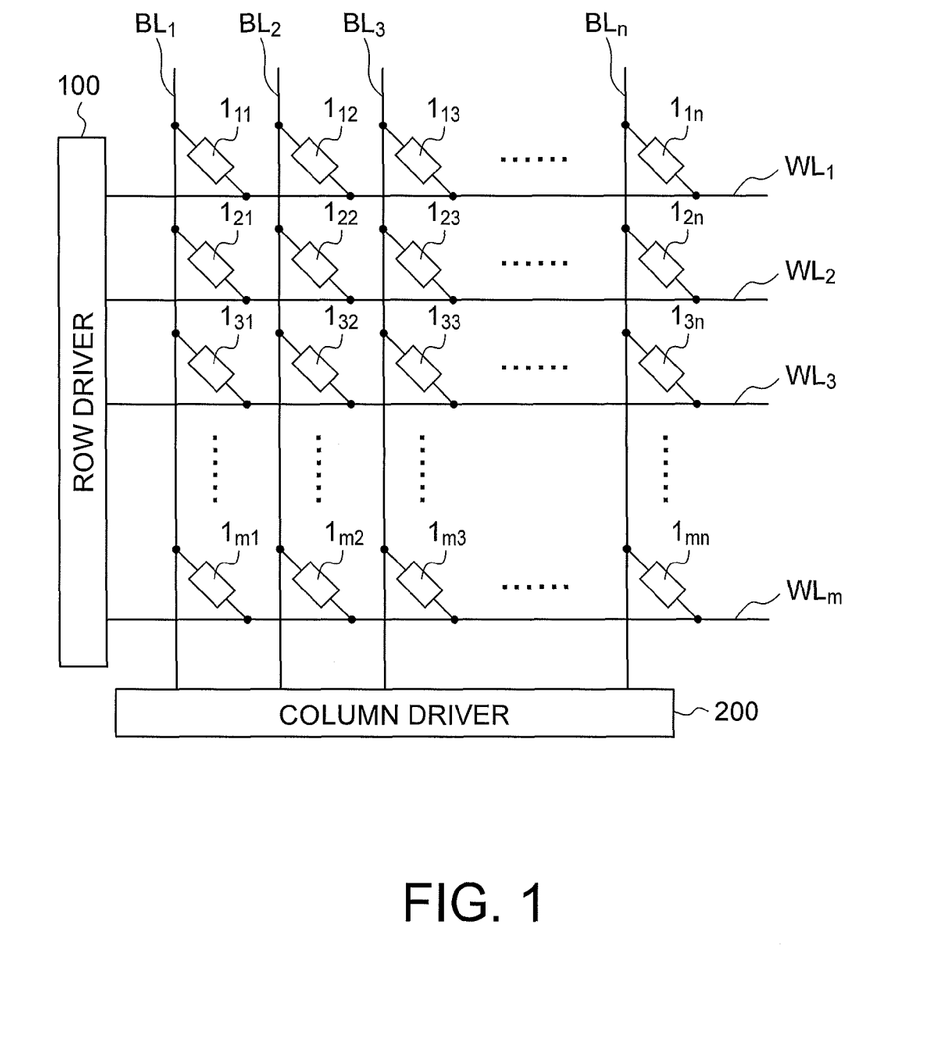
FIG. 1 is a schematic diagram of a reconfigurable circuit according to an embodiment.

FIG. 1 schematically shows a reconfigurable circuit according to an embodiment. The reconfigurable circuit according to the embodiment includes a bit line group with a plurality of bit lines $BL_1, BL_2, \ldots, BL_n$ ($n \geq 2$), a word line group with a plurality of word lines $WL_1, WL_2, \ldots, WL_m$ ($m \geq 2$) crossing the bit lines, and memory cells $1_{ij}$ each disposed at an intersection region of a word line $WL_i$ ($i=1, \ldots, m$) and a bit line $BL_j$ ($j=1, \ldots, n$). Hereinafter, this structure will be called crosspoint structure. One terminal of each of the memory cells $1_{i1}$-$1_{in}$ is connected to the word line $WL_i$ ($i=1, \ldots, m$). The other terminal of each of the memory cells $1_{1j}$-$1_{mj}$ is connected to the bit line $BL_j$ ($j=1, \ldots, n$). The word line group is connected to a row driver 100, and the bit line group is connected to a column driver 200. The row driver 100 is capable of selecting one of the word lines, and applying a voltage to the selected word line. The column driver 200 is capable of selecting one of the bit lines, and applying a voltage to the selected bit line. This allows a memory cell to be selected and programmed.

The memory cell of the embodiment is a nonvolatile resistive change element. The resistive change element has two terminals (electrodes), and the resistance between the terminals may be set to be in a low resistive state (LRS) or a high resistive state (HRS). In order to change the state, a predetermined program voltage is applied between the terminals of the resistive change element. Herein to change resistance of the resistive change element from the HRS to the LRS will be called "set", and to change the resistance from the LRS to the HRS will be called "reset." FIG. 2 shows a reconfigurable circuit including nonvolatile resistive change elements $2_{11}$-$2_{mn}$ serving as the memory cells $1_{11}$-$1_{mn}$ shown in FIG. 1.

Figure 3:
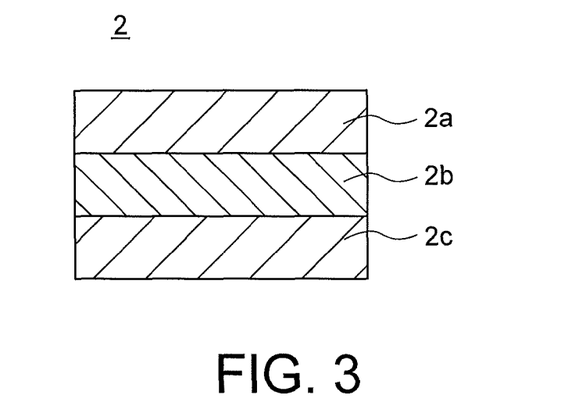
FIG. 3 is a cross-sectional view of an example of resistive change element.

FIG. 3 shows an example of a resistive change element. The resistive change element 2 includes an upper electrode 2a, a lower electrode 2c, and a resistive change layer 2b disposed between the upper electrode 2a and the lower electrode 2c. The upper electrode 2a, the lower electrode 2c, and the resistive change layer 2b each may be formed of a single layer of a single material, or may have a multilayer structure including a plurality of layers of a plurality of materials.

Figure 2:
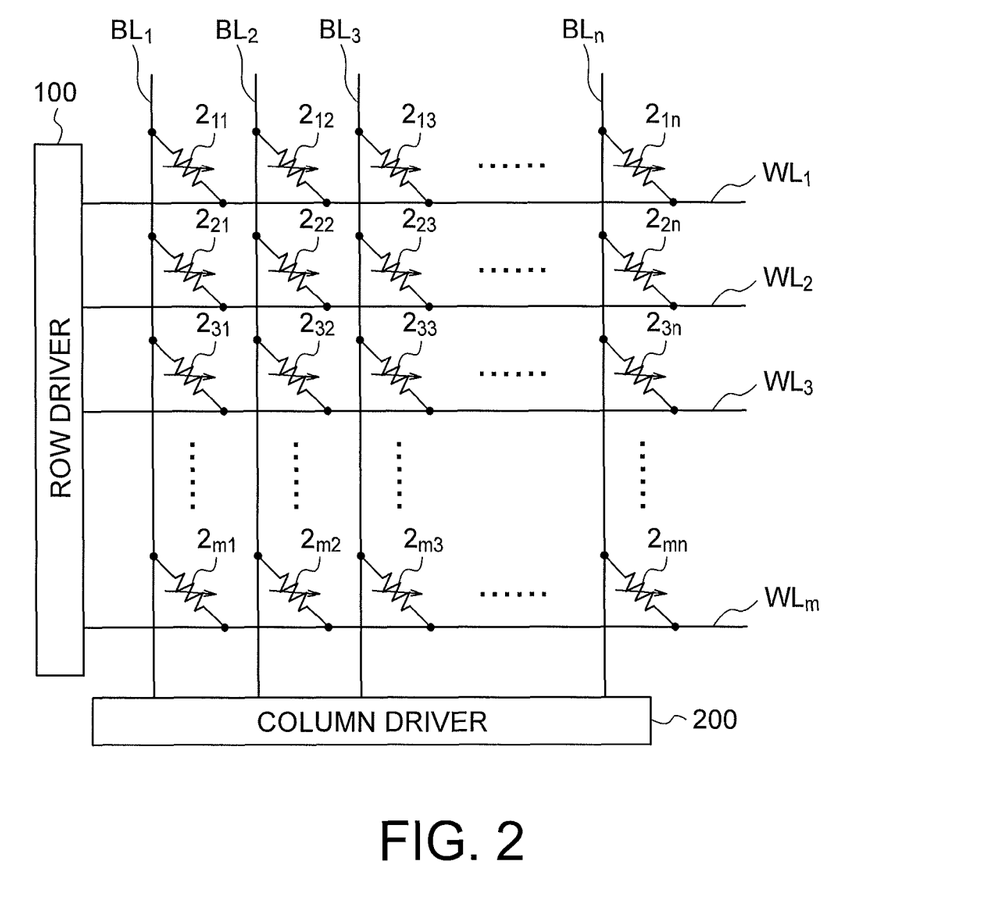
FIG. 2 is a circuit diagram of a reconfigurable circuit using nonvolatile resistive change elements as the memory cells shown in FIG. 1.

The reconfigurable circuit with a crosspoint structure shown in FIG. 2 may be used as, for example, a switching unit for switching the wiring lines in a programmable logic device. The switching unit may connect or disconnect a plurality of wiring lines as the necessity arises. For example, if a resistive change element at an intersection of two wiring lines is in a HRS, these wiring lines may not be connected, and if it is in a LRS, the wiring lines may be connected to each other.

Figure 4:
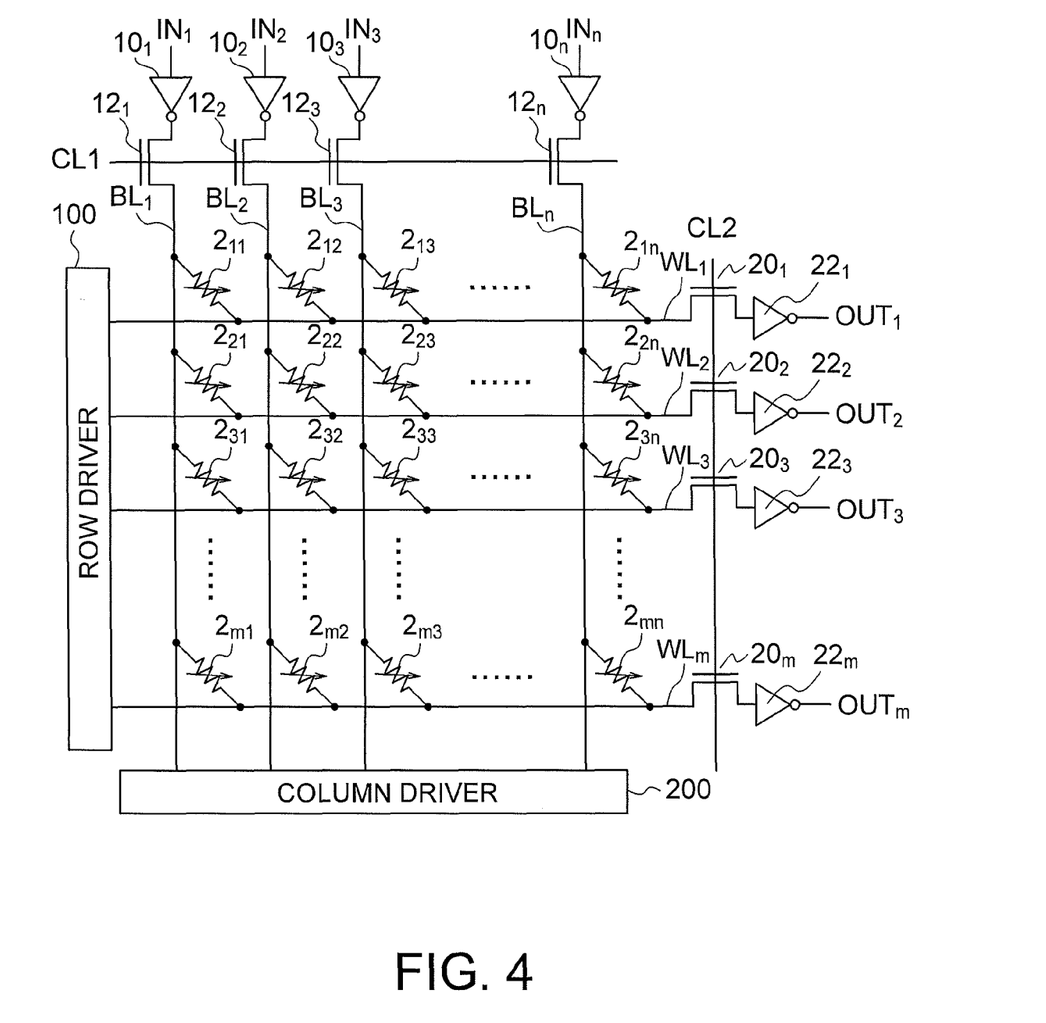
FIG. 4 is a diagram showing a switching unit for switching wiring lines using a reconfigurable circuit with a crosspoint structure according to the embodiment.

FIG. 4 shows an example of a switching unit for switching wiring lines using the reconfigurable circuit with a crosspoint structure according to the embodiment. In this switching unit, a signal is inputted to a bit line $BL_j$ ($j=1, \ldots, n$) via an input line $IN_j$, an inverter $10_j$, and a transistor $12_j$, and the signal is outputted from an output line $OUT_i$ via a resistive change element $2_{ij}$ ($i=1, \ldots, m$) in an LRS, a word line $WL_i$, a transistor $20_i$, and an inverter $22_i$.

The bit line $BL_j$ ($j=1, \ldots, n$) is connected to the output terminal of the inverter $10_j$ via the transistor $12_j$ of which the gate is connected to a wiring line CL1. The transistor $12_j$ ($j=1, \ldots, n$) is for blocking a voltage applied to program the resistive change element $2_{ij}$ ($i=1, \ldots, m$) from the inverter $10_j$, and is in an OFF state when the resistive change element $2_{ij}$ is being programmed (set or reset). The transistor $12_j$ ($j=1, \ldots, n$) may be omitted if the program voltage to be applied to the resistive change element is low. The n-type transistors used as the transistors $12_j$ ($j=1, \ldots, n$) in FIG. 4 may be replaced with p-type transistors.

The word line $WL_i$ ($i=1, \ldots, m$) is connected to the input terminal of the inverter $22_i$ via the transistor $20_i$ of which the gate is connected to a wiring line CL2. The transistor $20_i$ ($i=1, \ldots, m$) is for blocking the voltage applied to the resistive change element $2_{ij}$ from the inverter $22_i$, and is in the OFF state when the resistive change element is programmed (set or reset). The transistor $20_i$ ($i=1, \ldots, m$) may be omitted if the program voltage to be applied to the resistive change element is low. The n-type transistors used as the transistors $20_i$ ($i=1, \ldots, m$) in FIG. 4 may be replaced with p-type transistors.

Although the transistors $12_j$ ($j=1, \ldots, n$), $20_i$ ($i=1, \ldots, m$) are disposed on the signal input side and the signal output side in FIG. 4, only the transistors $12_j$ ($j=1, \ldots, n$) or the transistors $20_i$ ($i=1, \ldots, m$) may be disposed on the signal input side or the signal output side if the resistive change elements $2_{ij}$ are unipolar resistive change elements.

If the resistive change element $2_{11}$ is in the LRS and the resistive change elements $2_{12}, 2_{13}$ are in the HRS in FIG. 4, for example, the bit line $BL_1$ and the word line $WL_1$ may be connected to each other, and the bit lines $BL_2$, $BL_3$ and the word line $WL_1$ may not be connected to each other. As a result, a signal inputted from the input line $IN_1$ may be outputted from the output line $OUT_1$.

Furthermore, if the resistive change elements $2_{11}, 2_{21}$ are in the LRS and the resistive change element $2_{12}, 2_{13}, 2_{22}, 2_{23}$ are in the HRS in FIG. 4, the bit line $BL_1$ may be connected to the word lines $WL_1$, $WL_2$, and the bit lines $BL_2$ and $BL_3$ may not be connected to the word line $WL_1$ or the word line $WL_2$. As a result, a signal inputted to the input line $IN_1$ may be outputted from both the output lines $OUT_1$, $OUT_2$.

The aforementioned signal transmission from one input line to a plurality of output lines can be regarded as a possible example of a connection pattern of a switching unit. However, the opposite signal transmission from a plurality of input line to one output line is impossible. In other words, there may be a case where a plurality of resistive change elements connected to the same input line may be in the LRS, but there may not be a case where a plurality of resistive change elements connected to the same output line may be in the LRS.

If the crosspoint memory configuration shown in FIG. 2 is applied to a large capacity data storage medium (file memory), each resistive change element is independently in the LRS or HRS, and it is arbitrarily determined which of resistive change elements connected to the same bit line or word line is in the LRS, and how many resistive change elements are in the LRS. As a result, there may be a case where all of the resistive change elements $2_{11}$-$2_{mn}$ are in the LRS, and there may also be a case where all are in the HRS.

However, if the crosspoint-structure reconfigurable circuit shown in FIG. 4 is used as a switching unit for wiring lines, there is no need to consider all of combinations of the resistive states (whether each resistive change element is in the HRS or the LRS) of the resistive change elements.

Next, a programming method will be considered in a case where the resistive change element $2_{11}$ is switched from the HRS to the LRS in the switching unit shown in FIG. 4. It is assumed that the program voltage required for the setting is Vpgm.

Figure 5:
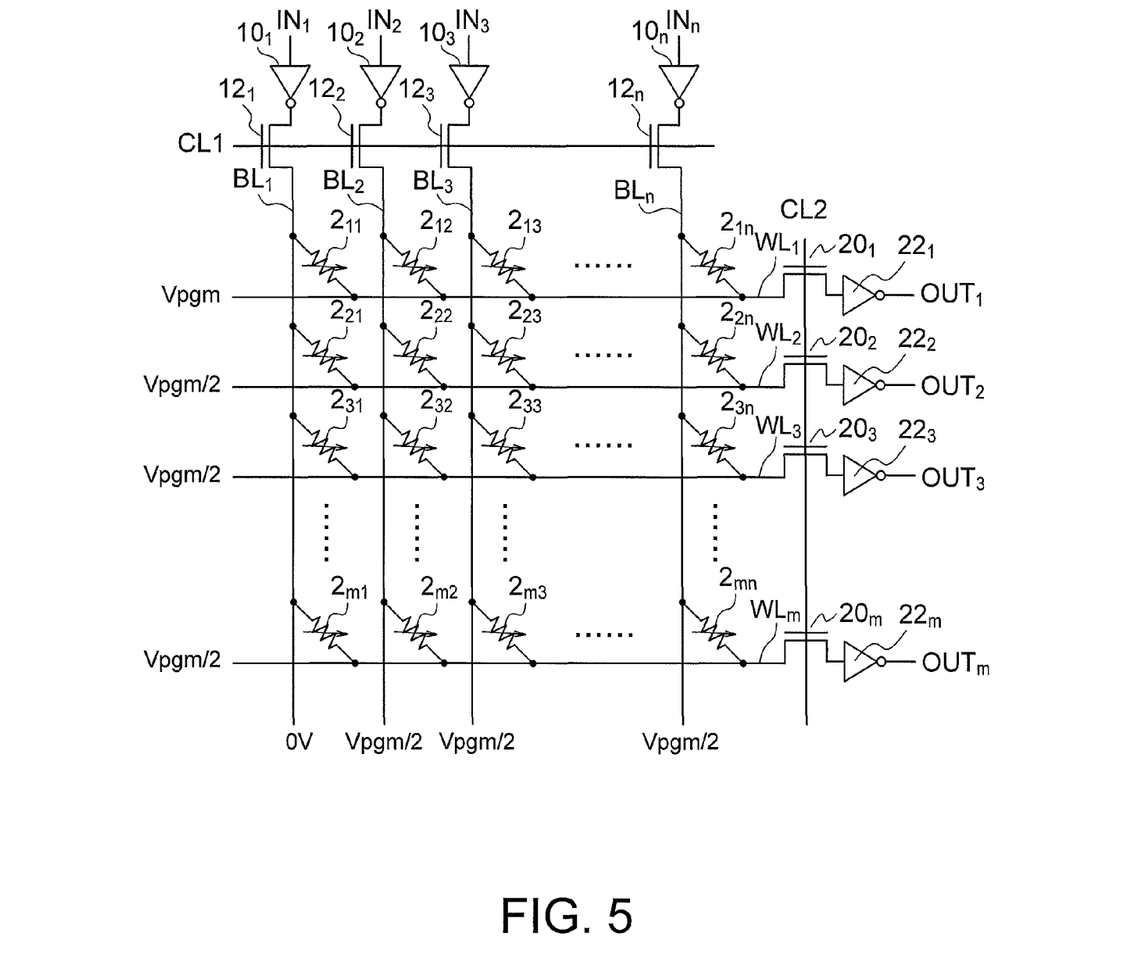
FIG. 5 is a diagram showing an example of a method of setting a resistive change element.

FIG. 5 shows an example of a method of setting the resistive change element $2_{11}$. A voltage 0 V is applied to the bit line $BL_1$, and the program voltage Vpgm is applied to the word line $WL_1$. This applies the program voltage Vpgm between the terminals of the resistive change element $2_{11}$, thereby setting the resistive change element $2_{11}$. A voltage between 0 V and the program voltage Vpgm, for example Vpgm/2, is applied to the other bit lines $BL_2$-$BL_n$ and the other word lines $WL_2$-$WL_m$. This is for preventing a program disturb (set disturb or reset disturb) of the non-selected resistive change elements.

Figure 6:
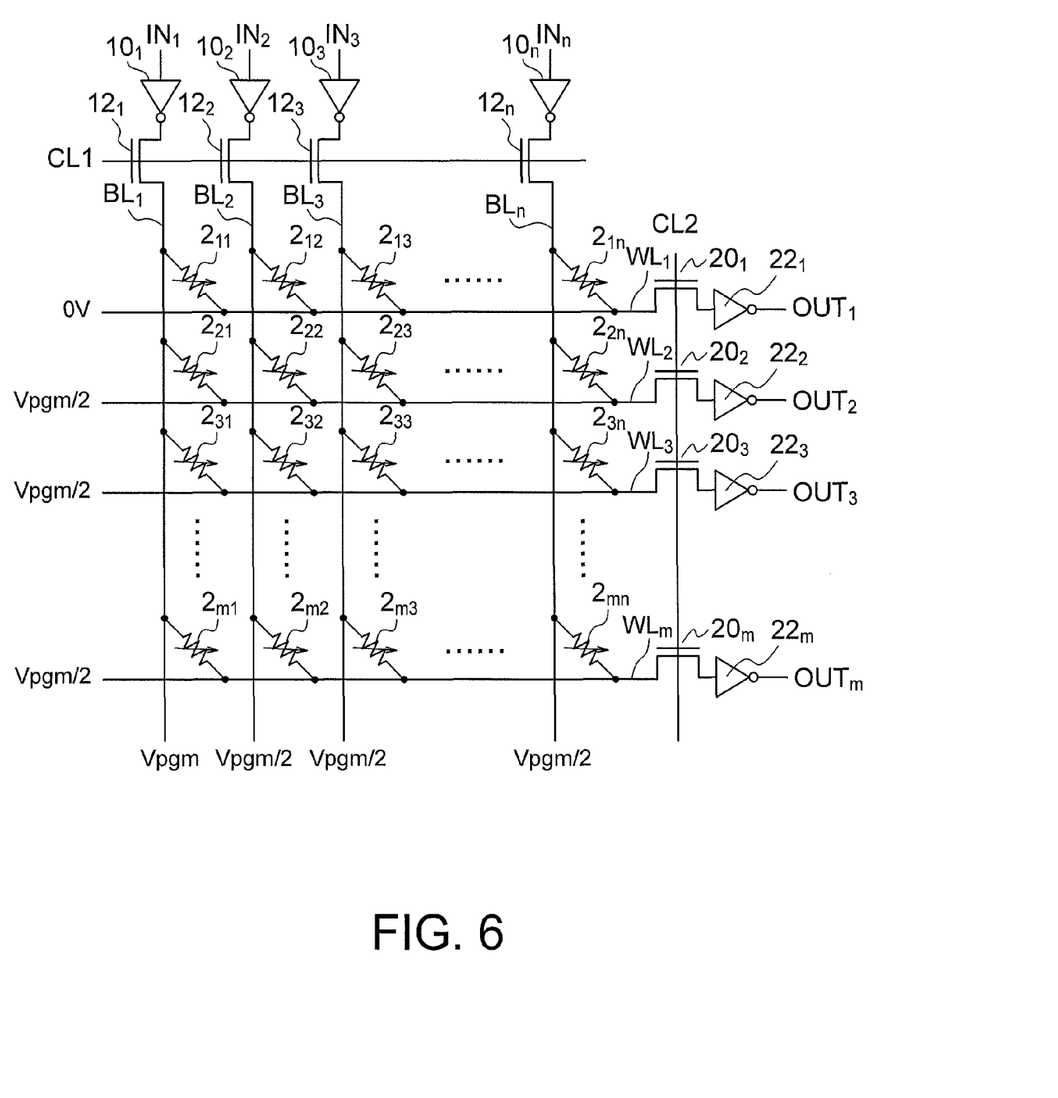
FIG. 6 is a diagram showing another example of a method of setting a resistive change element.

FIG. 6 shows another example of setting the resistive change element $2_{11}$. The program voltage Vpgm is applied to the bit line $BL_1$, and the voltage 0 V is applied to the word line $WL_1$. This applies the program voltage Vpgm between the terminals of the resistive change element $2_{11}$, thereby setting the resistive change element $2_{11}$. A voltage between 0 V and the program voltage Vpgm, for example Vpgm/2, is applied to the other bit lines $BL_2$-$BL_n$ and the other word lines $WL_2$-$WL_m$.

The voltages applied to the word lines in programming a resistive change element are controlled by the row driver 100, and the voltages applied to the bit lines are controlled by the column driver 200.

Whether the method shown in FIG. 5 or the method shown in FIG. 6 is used is dependent on, for example, the materials of the upper electrode and the lower electrode of the resistive change element. Changing the materials may lead to changing the voltage conditions required for the setting. For example, the voltage applied to the upper electrode of the resistive change element may be set to be higher than the voltage applied to the lower electrode in some cases, and may be set to be lower in other cases.

It is preferable that a mechanism be provided for preventing an excessive current from flowing between the terminals of the resistive change element when the resistive change element is switched from the HRS to the LRS. If the resistive change element is in the HRS, a current generated by applying a set voltage between the terminals of the resistive change element is low. However, at or after the time the resistive change element is switched to the LRS, a large current may be generated. The large current may cause great variations in the resistance of the set resistive change element.

A current limiting element disposed between a voltage source and a terminal of the resistive change element may effectively prevent the excessive current.

Figure 7A:
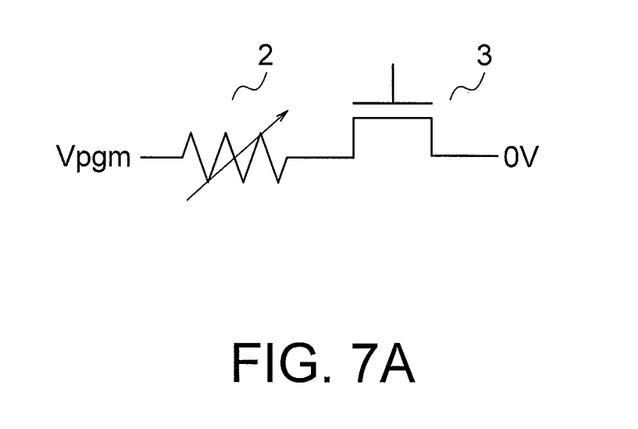
FIGS. 7A and 7B are diagrams each schematically showing conditions for setting a resistive change element when a transistor or a resistor is used as a current limiting element.

FIG. 7A is a diagram schematically showing conditions for setting a resistive change element if a transistor is used as the current limiting element. A resistive change element 2 and a transistor 3 are connected in series with each other, and a voltage 0 V and a program voltage Vpgm are applied to both sides thereof. In FIG. 7A, the program voltage Vpgm is applied to the terminal of the resistive change element 2, and 0 V is applied to one of the source and the drain of the transistor 3. However, 0 V may be applied to the terminal of the resistive change element 2, and the program voltage Vpgm may be applied to one of the source and the drain of the transistor 3.

The channel resistance of the transistor 3 may be set at an appropriate value by adjusting the voltage applied to the gate thereof. The resistance may control the current flowing through the transistor 3, i.e., the current flowing through the resistive change element 2, to be equal to or less than a predetermined value.

If one transistor is connected as the current limiting element to one resistive change element as described above, an increase in the number of resistive change elements leads to an increase in the number of transistors. As a result, the chip area may be increased for a circuit including a large number of resistive change elements.

Figure 7B:
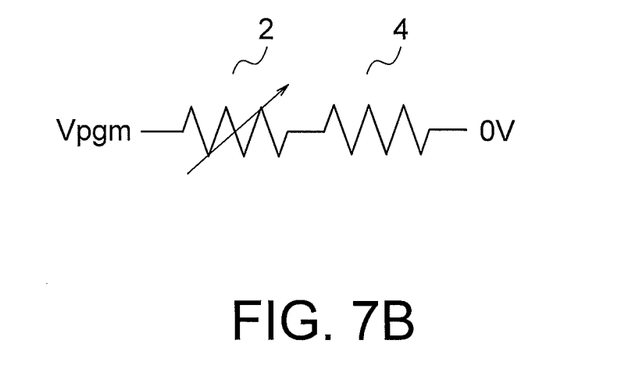

FIG. 7B schematically shows conditions for setting a resistive change element using a simple resistor as the current limiting element. As in the case of FIG. 7A, the resistive change element 2 and the resistor 4 is connected in series with each other, and 0 V and the program voltage Vpgm are applied to both the sides thereof. Although the program voltage Vpgm is applied to the terminal of the resistive change element 2 and 0 V is applied to the terminal of the resistor 4 in FIG. 7B, 0 V may be applied to the terminal of the resistive change element 2, and the program voltage Vpgm may be applied to the terminal of the resistor 4.

The increase in chip area may be suppressed in the configuration shown in FIG. 7B since the resistor instead of a transistor is used as the current limiting element. This is because the resistor 4 can be formed on a wiring layer together with the resistive change element 2. However, unlike a transistor, the resistance of the resistor 4 used as the current limiting element cannot be changed. Therefore, if one resistor serving as the current limiting element is disposed for one resistive change element, the resistance between the input line and the output line of the switching unit for switching wiring lines shown in FIG. 4 may be increased. This results in a decrease in signal transmission speed.

As described above, one current limiting element per one resistive change element is not preferable in the viewpoint of chip area and operational speed. Therefore, it is preferable that one current limiting element be shared by a plurality of resistive change elements.

Figure 8:
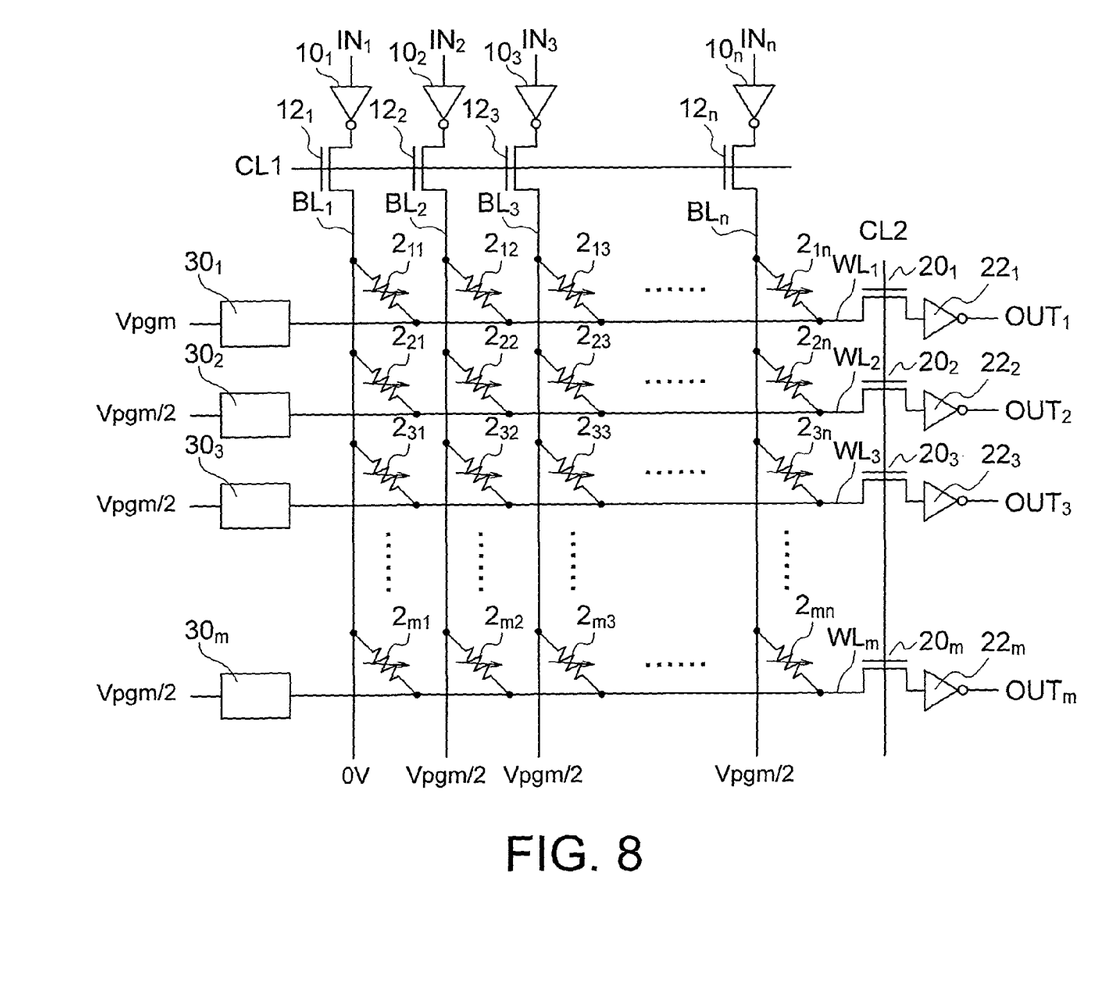
FIG. 8 is a diagram showing voltage conditions for setting a resistive change element in a circuit including current limiting elements each corresponding to one of word lines.

FIG. 8 shows voltage conditions for setting the resistive change element $2_{11}$ in the reconfigurable circuit according to the embodiment further including current limiting elements $30_1$-$30_m$ each corresponding to one of the word lines $WL_1$-$WL_m$. The current limiting element $30_i$ (i=1, ... , m) such as a transistor is connected to each word line $WL_i$. A program voltage Vpgm is applied to the word line $WL_1$, and 0 V is applied to the bit line $BL_1$. A voltage between 0 V and the program voltage Vpgm, for example Vpgm/2, is applied to the word lines $WL_2$-$WL_m$ and the bit lines $BL_2$-$BL_n$. The voltage Vpgm for programming the resistive change element $2_{11}$ is applied thereto via the current limiting element $30_1$. This prevents an excessive current to flow through the resistive change element $2_{11}$, and suppress variations in the resistance in the programmed resistive change element $2_{11}$. This configuration may lead to a smaller chip area as compared to the case where one or more current limiting elements are connected to one resistive change element since each current limiting element $30_i$ (i=1, ... , m) is shared by a plurality of resistive change elements $2_{i1}$-$2_{in}$.

Each current limiting element $30_i$ (i=1, ... , m) is connected to a word line $WL_i$ in this case. If the reconfigurable circuit according to the embodiment is used as a switching unit for switching wiring lines of a programmable logic device such as a field programmable gate array (FPGA) as shown in FIG. 4, a signal is inputted to one of the bit lines, and outputted through one of the word lines via one of the resistive change element in the LRS while the programmable logic device is operating. A voltage amplifier element such as an inverter or buffer is generally disposed on the signal path. In the circuit shown in FIG. 4, the bit line $BL_j$ (j=1, ..., n) is connected to the output terminal of the inverter $10_j$ via the transistor $12_j$, and the word line $WL_i$ (i=1, ..., m) is connected to the input terminal of the inverter $22_i$ via the transistor $20_i$. The signal transmission direction is determined by the orientation of the aforementioned amplifier element. Therefore, one of the bit line and the word line connected to the output terminal of an amplifier element may be regarded as the wiring line to which signals are inputted (input wiring line), and the other connected to the input terminal of an amplifier element may be regarded as the wiring line from which signals are outputted (output wiring line).

Generally, the input terminal of the amplifier element corresponds to the gates of one or more transistors, and the output terminal thereof corresponds to the drains thereof. Therefore, one of the bit line and the word line connected to the gates of the transistors may be regarded as the output wiring line, and the other connected to the drains of the transistors may be regarded as the input wiring line.

Figure 9:
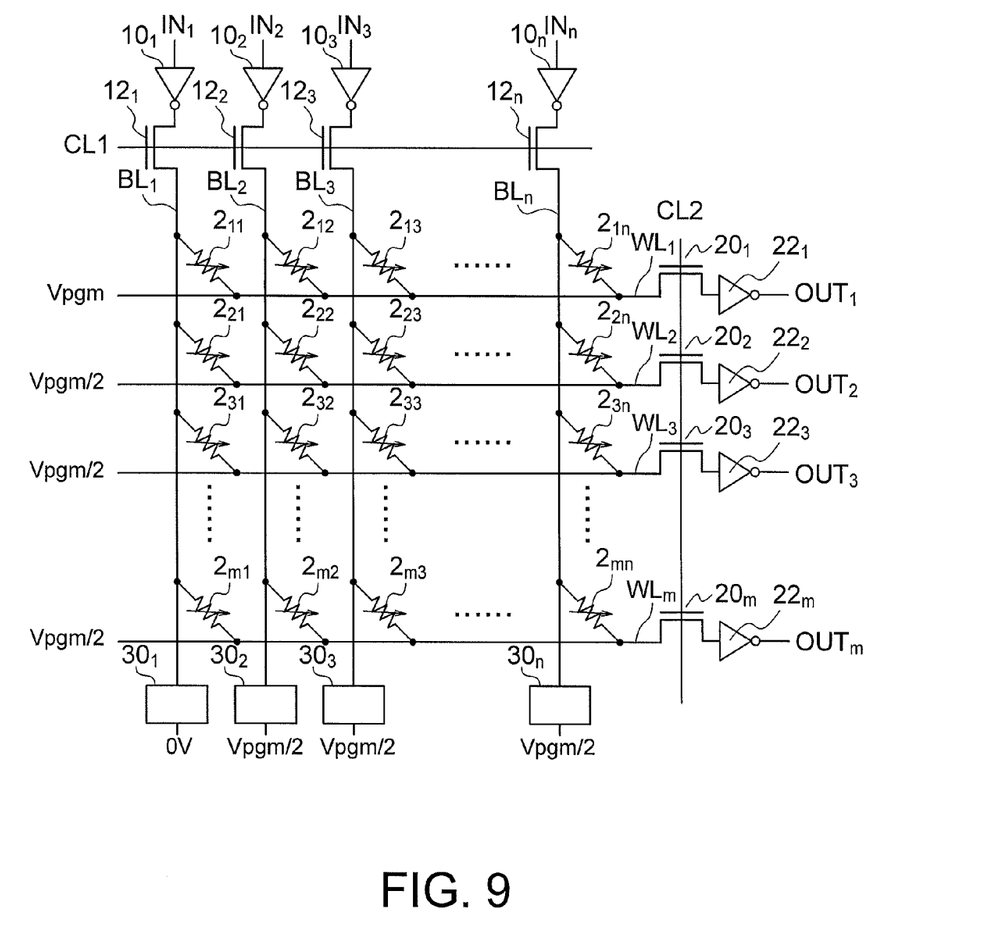
FIG. 9 is a diagram showing voltage conditions for setting a resistive change element in a circuit including current limiting elements each corresponding to one of bit lines.

FIG. 9 shows voltage conditions for setting the resistive change element $2_{11}$ in the reconfigurable circuit shown in FIG. 4 further including current limiting elements $30_j$ each corresponding to one of the bit lines $BL_j$ (j=1, ..., n) serving as input wiring lines. This circuit may also control, by means of the current limiting elements $30_1$-$30_n$, the current flowing through the resistive change element, but may have the following problem.

In the circuit shown in FIG. 9, the resistive change element $2_{11}$ before being set is in the HRS. It is assumed that the resistive change element $2_{21}$ at this time is in the LRS. In order to change the state of the resistive change element $2_{11}$ form the HRS to the LRS, a program voltage Vpgm is applied to the word line $WL_1$, and 0 V is applied to the bit line $BL_1$ via the current limiting element $30_1$. The potential of the bit line $BL_1$ is ideally 0V. However, the potential of the bit line $BL_1$ is dependent on the voltage applied to the word line $WL_2$ since the resistive change element $2_{21}$ is in the LRS. If the resistance of the current limiting element $30_1$ is satisfactorily low, the voltage 0 V applied to the current limiting element $30_1$ is applied to the bit line $BL_1$ without being modulated since no voltage drop is caused in the current limiting element $30_1$. However, the resistance of the current limiting element $30_1$ in the circuit shown in FIG. 9 should be set to be a relatively high in order to prevent an excessive current from flowing through the resistive change element $2_{11}$. If the resistance of the current limiting element $30_1$ is substantially the same as or higher than the resistance of the resistive change element $2_{21}$ that is in the LRS, a non-negligible voltage drop may be caused at the current limiting element $30_1$, which makes the potential of the bit line $BL_1$ higher than 0 V. If this occurs, a sufficient set voltage is not applied between the terminals of the resistive change element $2_{11}$, and the resistive change element $2_{11}$ may not be set.

As described above, two or more of the resistive change elements connected to the same bit line, for example the resistive change elements $2_{11}, 2_{21}, 2_{31}, \ldots, 2_{m1}$ connected to the bit line $BL_1$, may be in the LRS at the same time in the circuit configuration shown in FIGS. 8 and 9. This occurs when a signal inputted to one of the input lines, for example the input line $IN_1$, is intended to be outputted from a plurality of output lines, for example the output lines $OUT_1$ and $OUT_2$. In this case, if the current limiting elements are disposed at locations connecting to the bit lines serving as signal input wiring lines as shown in FIG. 9, a set voltage may not be correctly applied to a target resistive change element to be set.

However, two or more of the resistive change elements connected to the same word line, for example the resistive change elements $2_{11}, 2_{12}, 2_{13}, \ldots, 2_{1n}$ connected to the word line $WL_1$, cannot be in the LRS at the same time in the circuit configurations shown in FIGS. 8 and 9. Therefore, the aforementioned problem can be solved if the current limiting elements are disposed at locations connecting to the word lines (output wiring lines) as shown in FIG. 8.

If a resistive change element, for example the resistive change element $2_{11}$, is switched from the HRS to the LRS, the other resistive change elements $2_{12}, 2_{13}, \ldots, 2_{1n}$ connected to the word line $WL_1$ should be in the HRS. Therefore, the connection of the wiring lines should be changed in a predetermined manner. For example, if a resistive change element in the LRS and a resistive change element in the HRS are connected to the same word line, and the resistive change element in the LRS is switched to the HRS and the resistive change element in the HRS is switched to the LRS, the resistive change element in the LRS should be switched to the HRS first, and then the resistive change element in the HRS should be switched to the LRS. For example, if the resistive change element $2_{11}$ is in the LRS and the resistive change elements $2_{12}, 2_{13}, \ldots, 2_{1n}$ are in the HRS, i.e., the input line $IN_1$ and the output line $OUT_1$ are connected to each other, and the wiring line state is switched so that the resistive change element $2_{12}$ is in the LRS and the resistive change element $2_{11}, 2_{13}, \ldots, 2_{1n}$ are in the HRS, i.e., the input line $IN_2$ and the output line $OUT_1$ are connected to each other, the resistive change element $2_{11}$ is first switched from the LRS to the HRS, and then the resistive change element $2_{12}$ is switched from the HRS to the LRS.

The conditions for setting a selected resistive change element have been described so far. Some resistive change elements may need a process called "forming" after being manufactured, depending on the types or the thicknesses of films included in the resistive change elements. In a resistive change element immediately after being manufactured, the resistive change layer $2b$ shown in FIG. 3 has a very high insulating property. A predetermined value of voltage applied between the electrodes $2a$, $2c$ decreases the resistance between the electrodes $2a$, $2c$ to cause the resistive change layer $2b$ to become active. If a program voltage is applied between the electrodes $2a$, $2c$ in this state, the resistance of the resistive change element can be freely controlled. The forming is generally required if the thickness of the resistive change layer $2b$ is relatively high, and may not be required if the thickness of the resistive change layer $2b$ is as thin as about a few nm.

A mechanism for controlling the current flowing through the resistive change element is preferably provided in forming the resistive change element as well as in setting the resistive change element. A method of forming a resistive change element in a circuit including current limiting elements $30_i$ connected to word lines $WL_i$ (i=1, ..., m) as shown in FIG. 8 will be described. For example, if the forming of the resistive change element $2_{11}$ is to be performed, 0 V is applied to the bit line $BL_1$, and a forming voltage Vpgm is applied to the word line $WL_1$ via the current limiting element $30_1$. The magnitude and the polarity may differ between the forming voltage Vpgm and the set voltage. Furthermore, the forming voltage Vpgm may be applied to the bit line, and 0 V may be applied to the word line via the current limiting element.

In the forming of a resistive change element connected to a word line with a current limiting element, for example the resistive change element $2_{11}$, a sufficient forming voltage may not be applied to the selected resistive change element if the resistance of the other resistive change elements connected to the same word line, for example the resistive change elements $2_{12}, 2_{13}, \ldots, 2_{1n}$, are substantially the same as or lower than the resistance of the current limiting element $30_1$. In particular, if the forming causes the resistance of the resistive change element to be substantially the same as that in the LRS, the resistive change element should be brought to the HRS by applying a reset voltage thereto immediately after the forming thereof. For example, if the forming of the resistive change element $2_{11}$ causes the resistive change element $2_{11}$ to become in the LRS, it is difficult to apply a sufficient forming voltage to the resistive change element $2_{12}$ and the resistive change element $2_{13}$. Therefore, after the forming, the resistive change element $2_{11}$ should be temporarily brought to the HRS. This allows a sufficient forming voltage to be applied to the resistive change element $2_{12}$ and the resistive change element $2_{13}$.

Alternatively, the resistance of the current limiting element during the forming may be set to be greater than that in the setting. The increase in the resistance of the current limiting element may prevent the resistance of the resistive change element after the forming from decreasing to about the same as the resistance in the LRS. The resistance of the current limiting element may be changed by using a transistor as the current limiting element, and changing the gate voltage to be applied thereto. Alternatively, a plurality of transistors each having a different channel width or channel length may be prepared, and one of the transistors may be selected and used. Furthermore, a plurality of resistors each having a different resistance may be prepared, and one of the resistors may be selected and used.

Figure 12:
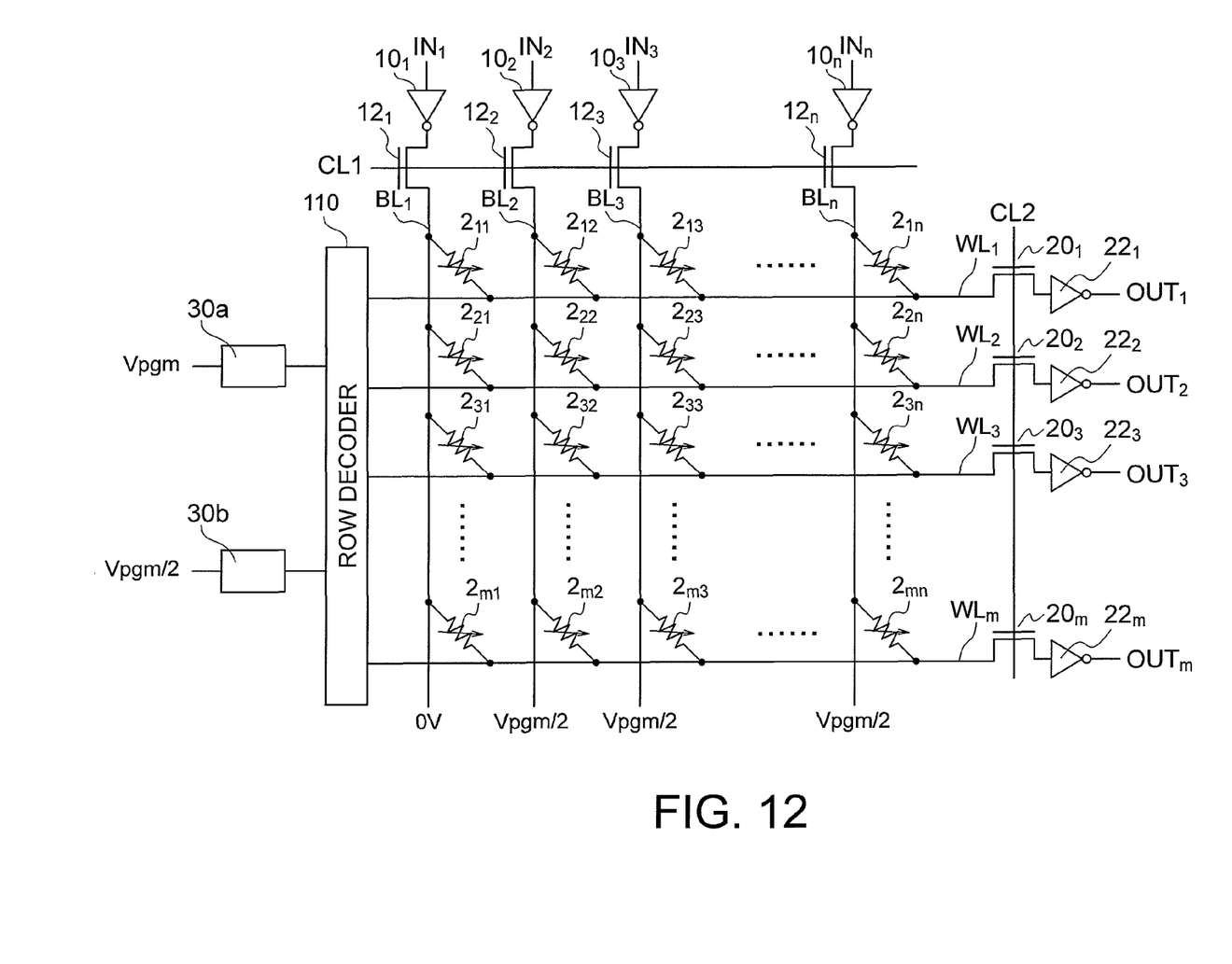
FIG. 12 is a diagram showing a modification in which current limiting elements are connected to word lines.

Although the current limiting elements $30_1$-$30_m$ are disposed in FIG. 8 so that each corresponds to one of the word lines $WL_1$-$WL_m$, a row decoder 110 for controlling the connection of the wiring lines may be disposed between current limiting elements 30a, 30b and word lines $WL_1$-$WL_m$ as shown in FIG. 12. A first voltage source for generating a voltage Vpgm is connected to the row decoder 110 via the current limiting element 30a, and a second voltage source for generating a voltage Vpgm/2 is connected to the row decoder 110 via the current limiting element 30b. In setting the resistive change element $2_{11}$, the row decoder 110 connects the word line $WL_1$ and the first voltage source via the current limiting element 30a, and the word lines $WL_2$-$WL_m$ and the second voltage source via the current limiting element 30b. The circuit area of the configuration shown in FIG. 12 may be reduced since an increase in the number of the word lines $WL_1$-$WL_m$ does not lead to an increase in the number of current limiting elements.

Figure 10:
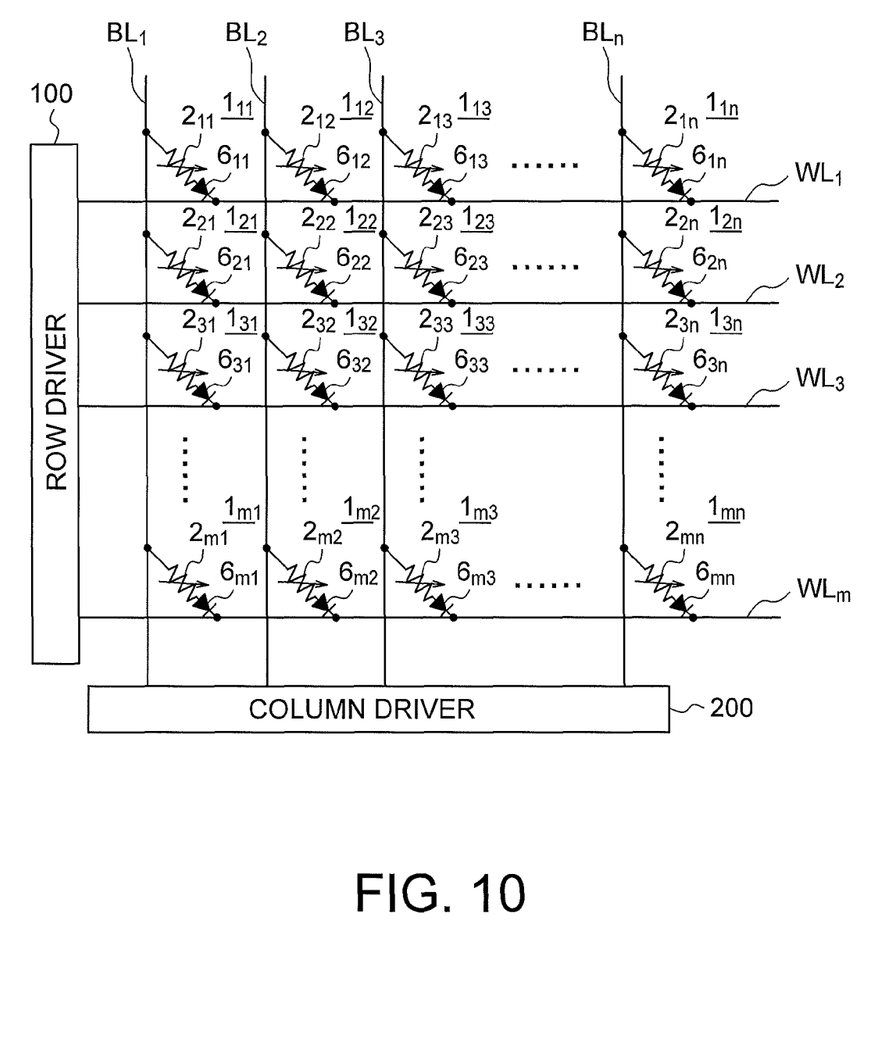
FIG. 10 is a circuit diagram showing a crosspoint-structure reconfigurable circuit in which each memory cell includes a resistive change element and a diode connected in series with the resistive change element.

A crosspoint-structure reconfigurable circuit is known, in which each of memory cells $1_{ij}$ (i=1, ... m, j=1, ..., n) includes a resistive change element $2_{ij}$ and a diode $6_{ij}$; connected in series with the resistive change element $2_{ij}$, as shown in FIG. 10. Diodes have a rectifying property to cause a current to flow only in one direction and to prevent the current from flowing in the opposite direction. Although the anode of each diode $6_{ij}$ (i=1, ... m, j=1, ..., n) is connected to a corresponding resistive change element $2_{ij}$ in FIG. 10, an equivalent circuit can be obtained if the cathode is connected to the resistive change element $2_{ij}$. An equivalent circuit may also be obtained if the resistive change element itself has a rectifying property instead of being connected in series to a separately formed diode.

The technique of inserting diodes is effective in forming a file memory with a crosspoint memory structure. However, the presence of a diode between a bit line and a word line as shown in FIG. 10 is not preferable in a switching unit for switching wiring lines as in this embodiment. The reason for this will be described below.

Figure 11:
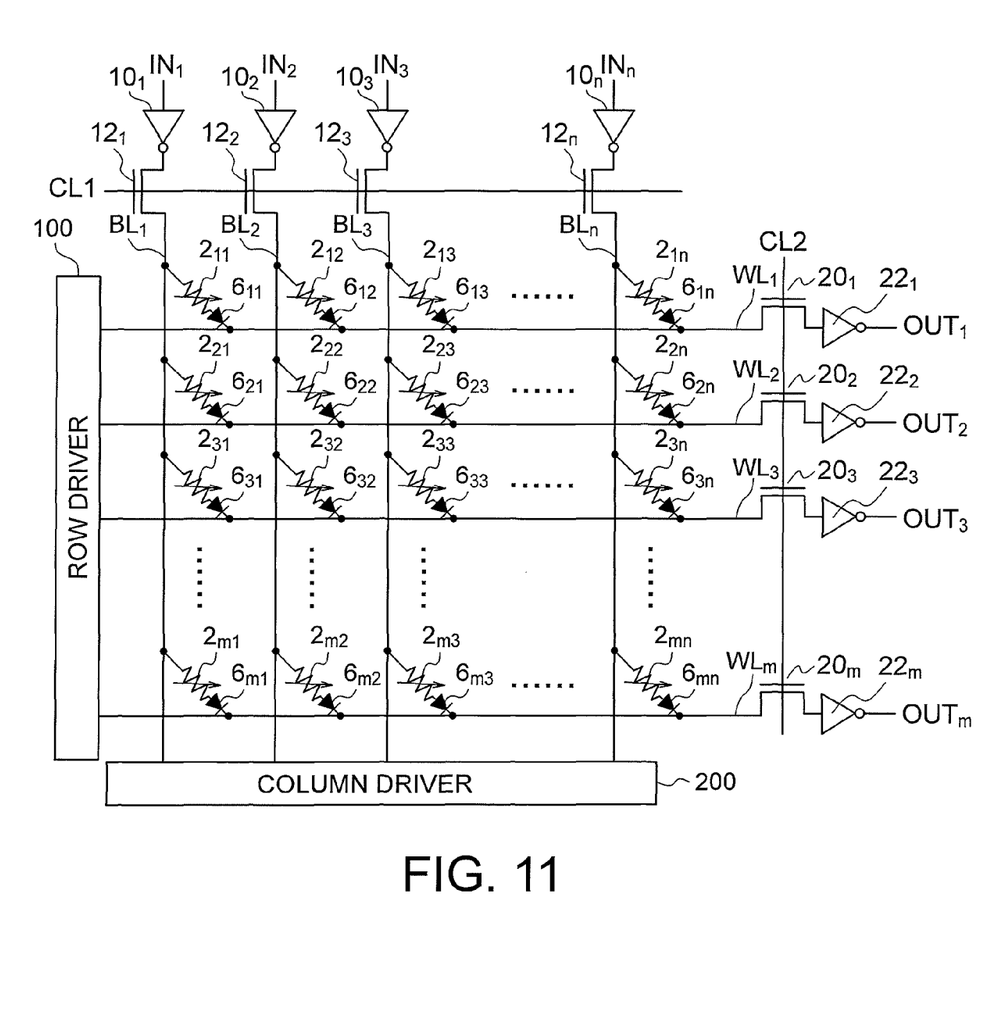
FIG. 11 is a circuit diagram showing an example in which a switching unit that switches wiring lines is obtained using the reconfigurable circuit shown in FIG. 10.

FIG. 11 shows an example of a switching unit for switching wiring lines using the reconfigurable circuit shown in FIG. 10. The signal transmission speed of a diode may greatly differ between a case where an H (high) level signal is inputted to an input line and a case where an L (low) level signal is inputted to the input line since the diode only allows a current to be passed in one direction. For example, if a diode is inserted so that it is in a forward direction when an H level signal is inputted to an input line, the inputted H level signal is outputted at a high speed. However, if the signal inputted is switched from the H level to the L level, the diode is in a backward direction relative to the signal direction. As a result, it takes a time to switch the output signal from the H level to the L level. This means that the operational frequency of the circuit is delayed.

Therefore, each memory cell between a bit line and a word line in the wiring line switching unit according to the embodiment preferably does not have a rectifying property. Specifically, it is preferable that no diode is present between the bit line and the word line, and the resistive change element in the LRS itself does not have a rectifying property.

The rectifying property here means that if a power supply voltage (for example 1.1 V) is applied between the terminals, a difference in current value may be caused by a difference in direction of the voltage. For example, assuming that a current flowing between a first terminal and a second terminal of an element is I1 when a power supply voltage is supplied to the first terminal and a ground voltage is supplied to the second terminal, and that the current is I2 when the ground voltage is applied to the first terminal and the power supply voltage is applied to the second terminal, the element can be determined to have a rectifying property if the ratio between the absolute value of I1 and the absolute value of I2 is 10 or more, or 1/10 or less.

As described above, since a current limiting element is disposed to correspond to a plurality of word lines or a plurality of bit lines in the embodiment, variations in the resistance of the resistive change elements disposed in intersection regions of a plurality of wiring lines can be suppressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A reconfigurable circuit comprising:
a first wiring line group including a plurality of first wiring lines to which signals are inputted;

a second wiring line group including a plurality of second wiring lines from which signals are outputted, the second wiring lines crossing the first wiring lines;

a plurality of resistive change elements disposed in intersection regions of the first wiring lines and the second wiring lines, each of the resistive change elements including a first terminal connected to one of the first wiring lines and a second terminal connected to one of the second wiring lines, and each of the resistive change elements being switchable between a low-resistance state and a high-resistance state;

a first control circuit configured to control a voltage to be applied to the first wiring lines;

a second control circuit configured to control a voltage to be applied to the second wiring lines; and a plurality of current limiting elements corresponding to the second wiring lines, and each of the current limiting elements being configured to control current flowing through the resistive change elements connected to the corresponding second wiring line.

2. The circuit according to claim 1, further comprising a plurality of first inverters corresponding to the first wiring lines, wherein each of the first wiring lines is connected to an output terminal of the corresponding one of the first inverters.

3. The circuit according to claim 1, further comprising a plurality of second inverters corresponding to the second wiring lines, wherein each of the second wiring lines is connected to an input terminal of the corresponding one of the second inverters.

4. The circuit according to claim 2, further comprising a plurality of first transistors corresponding to the first wiring lines, wherein each of the first transistors is connected between the corresponding one of the first wiring lines and one of the first inverters corresponding to the corresponding one of the first wiring lines.

5. The circuit according to claim 3, further comprising a plurality of second transistors corresponding to the second wiring lines, wherein each of the second transistors is connected between the corresponding one of the second wiring lines and one of the second inverters corresponding to the corresponding one of the second wiring lines.

6. The circuit according to claim 1, wherein the resistive change elements do not have a rectifying property in the low-resistance state.

7. The circuit according to claim 1, wherein each of the first terminals of the resistive change elements is directly connected to the corresponding one of the first wiring lines, and each of the second terminals is directly connected to the corresponding one of the second wiring lines.

8. A method of programming the reconfigurable circuit according to claim 1, comprising, when switching one of two elements among the resistive change elements connected in common to one of the second wiring lines from the low-resistance state to the high-resistance state and the other from the high-resistance state to the low-resistance state:

switching the one of the resistive change elements from the low-resistance state to the high-resistance state, followed by switching the other of the resistive change elements from the high-resistance state to the low-resistance state.

9. A method of programming the reconfigurable circuit according to claim 1, comprising, when switching one of the resistive change elements from the high-resistance state to the low-resistance state:

applying a first voltage to the first wiring line to which the first terminal of the one of the resistive change elements is connected, and applying a second voltage to at least one of the first wiring lines other than the one to which the first voltage is applied, by the first control circuit; and applying a third voltage to one of the second wiring lines to which the second terminal of the one of the resistive change elements is connected, and applying a fourth voltage to at least one of the second wiring lines other than the one to which the third voltage is applied, by the second control circuit, a value of the second voltage and a value of the fourth voltage being between a value of the first voltage and a value of the third voltage.

10. The method according to claim 9, wherein one of the first voltage and the third voltage is a program voltage, and the other is a ground voltage.

11. The method according to claim 9, wherein the value of the second voltage and the value of the fourth voltage are a middle value between the value of the first voltage and the value of the third voltage.

12. A reconfigurable circuit comprising:

a first wiring line group including a plurality of first wiring lines to which signals are inputted;

a second wiring line group including a plurality of second wiring lines from which signals are outputted, the second wiring lines crossing the first wiring lines;

a plurality of resistive change elements disposed in intersection regions of the first wiring lines and the second wiring lines, each of the resistive change elements including a first terminal connected to one of the first wiring lines and a second terminal connected to one of the second wiring lines, and each of the resistive change elements being switchable between a low-resistance state and a high-resistance state;

a first control circuit configured to control a voltage to be applied to the first wiring lines;

a second control circuit configured to control a voltage to be applied to the second wiring lines; and a current limiting element corresponding to the second wiring line group, and being configured to control current flowing through the resistive change elements connected to the second wiring lines.

13. The circuit according to claim 12, further comprising a plurality of first inverters corresponding to the first wiring lines, wherein each of the first wiring lines is connected to an output terminal of the corresponding one of the first inverters.

14. The circuit according to claim 12, further comprising a plurality of second inverters corresponding to the second wiring lines, wherein each of the second wiring lines is connected to an input terminal of the corresponding one of the second inverters.

15. The circuit according to claim 13, further comprising a plurality of first transistors corresponding to the first wiring lines, wherein each of the first transistors is connected between the corresponding one of the first wiring lines and one of the first inverters corresponding to the corresponding one of the first wiring lines.

16. The circuit according to claim 14, further comprising a plurality of second transistors corresponding to the second wiring lines, wherein each of the second transistors is connected between the corresponding one of the second wiring lines and one of the second inverters corresponding to the corresponding one of the second wiring lines.

17. The circuit according to claim 12, further comprising a decoder connected between the current limiting element and the second wiring lines.

18. A method of programming the reconfigurable circuit according to claim 12, comprising, when switching one of two elements among the resistive change elements connected in common to one of the second wiring lines from the low-resistance state to the high-resistance state and the other from the high-resistance state to the low-resistance state:
- switching the one of the resistive change elements from the low-resistance state to the high-resistance state, followed by switching the other of the resistive change elements from the high-resistance state to the low-resistance state.

19. A method of programming the reconfigurable circuit according to claim 12, comprising, when switching one of the resistive change elements from the high-resistance state to the low-resistance state:
- applying a first voltage to the first wiring line to which the first terminal of the one of the resistive change elements is connected, and applying a second voltage to at least one of the first wiring lines other than the one to which the first voltage is applied, by the first control circuit; and
- applying a third voltage to one of the second wiring lines to which the second terminal of the one of the resistive change elements is connected, and applying a fourth voltage to at least one of the second wiring lines other than the one to which the third voltage is applied, by the second control circuit,
- a value of the second voltage and a value of the fourth voltage being between a value of the first voltage and a value of the third voltage.

20. The method according to claim 19, wherein the value of the second voltage and the value of the fourth voltage are a middle value between the value of the first voltage and the value of the third voltage.

* * * * *